(12) United States Patent
Xu

(10) Patent No.: US 12,004,370 B2
(45) Date of Patent: Jun. 4, 2024

(54) DISPLAY PANELS, AND DISPLAY SCREENS

(71) Applicant: KUNSHAN GO-VISIONOX OPTO-ELECTRONICS CO., LTD., Kunshan (CN)

(72) Inventor: Lixiong Xu, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 707 days.

(21) Appl. No.: 17/151,693

(22) Filed: Jan. 19, 2021

(65) Prior Publication Data

US 2021/0193967 A1 Jun. 24, 2021

Related U.S. Application Data

(63) Continuation of application No. PCT/CN2019/090894, filed on Jun. 12, 2019.

(30) Foreign Application Priority Data

Dec. 14, 2018 (CN) .......................... 201811538742.4

(51) Int. Cl.
*H10K 50/856* (2023.01)
*H10K 50/86* (2023.01)
(Continued)

(52) U.S. Cl.
CPC ......... *H10K 50/856* (2023.02); *H10K 50/865* (2023.02); *H10K 59/122* (2023.02);
(Continued)

(58) Field of Classification Search
None
See application file for complete search history.

(56) References Cited

U.S. PATENT DOCUMENTS

2009/0224660 A1* 9/2009 Nakanishi ............ H10K 50/856
                                                            313/504
2010/0033823 A1 2/2010 Suessner et al.
(Continued)

FOREIGN PATENT DOCUMENTS

CN 101716843 A 6/2010
CN 106843618 A 6/2017
(Continued)

OTHER PUBLICATIONS

Chinese Notification of First Office Action for corresponding Chinese Application No. 2018115387422.
(Continued)

*Primary Examiner* — Alexander G Ghyka
(74) *Attorney, Agent, or Firm* — KILPATRICK TOWNSEND & STOCKTON LLP

(57) ABSTRACT

The present application relates to a display panel, a display screen and a display terminal, wherein the display panel comprises a substrate, having a first surface for an external light entering therein and a second surface for an external light exiting therefrom; and at least one diffractive relief structure, provided on the second surface of the substrate and used for reducing or eliminating a diffractive light formed on the second surface by the external light passing through the substrate. The diffractive relief structure is arranged on the second surface of the display panel, and can be used to effectively eliminate the positive and negative order diffractive light formed on the second surface of the substrate by the external light entering the first surface of the substrate and exiting from the second surface.

10 Claims, 6 Drawing Sheets

(51) Int. Cl.
  *H10K 59/122* (2023.01)
  *H10K 59/131* (2023.01)
  *H10K 59/176* (2023.01)
  *H10K 59/60* (2023.01)
(52) U.S. Cl.
  CPC ......... *H10K 59/131* (2023.02); *H10K 59/176* (2023.02); *H10K 59/60* (2023.02)

(56) References Cited

U.S. PATENT DOCUMENTS

2017/0179441 A1  6/2017  Lee et al.
2020/0132907 A1  4/2020  Tan

FOREIGN PATENT DOCUMENTS

| CN | 107065370 A | 8/2017 |
| CN | 108089253 A | 5/2018 |
| CN | 207502767 U | 6/2018 |
| CN | 108769304 A | 11/2018 |
| JP | 2003255110 A | 9/2003 |
| WO | 2016139769 A1 | 9/2016 |

OTHER PUBLICATIONS

Search Report of International Application No. PCT/CN2019/090894.
Written Opinion of International Application No. PCT/CN2019/090894.

* cited by examiner

DISPLAY PANELS, AND DISPLAY SCREENS

CROSS-REFERENCE TO RELATED APPLICATIONS

The present application is a continuation to international application No. PCT/CN2019/090894, filed on Jun. 12, 2019, which claims priority to Chinese Patent Application No. 201811538742.4, filed on Dec. 14, 2018. Both applications are incorporated by reference herein in their entireties for all purposes.

TECHNICAL FIELD

The present application relates to the field of display technology.

BACKGROUND

With rapid development of display terminals, users have an increasingly high level of demands for screen ratio. Since components such as cameras, sensors, earpieces, etc. need to be installed on the top of the screen, a certain area on the top of the screen, such as the front bangs area of the screen of the Apple Phone iPhone X, is usually reserved for installing the above components. Such configuration influences the overall consistency of the screen.

SUMMARY

Aimed to solve the above technical problems, the present application provides a display panel, and a display screen.

A first aspect of the present application provides a display panel, comprising a substrate, having a first surface for an external light entering therein and a second surface for an external light exiting therefrom; at least one diffractive relief structure, provided on the second surface of the substrate and used for reducing or eliminating a diffractive light formed on the second surface by the external light passing through the substrate.

A second aspect of the present application provides a display screen, comprising a first display area and a second display area; wherein the first display area is provided with the display panel according to any one of the first aspect, and the second display area is provided with a passive matrix organic light emitting diode (PMOLED) display panel or an active matrix organic light emitting diode (AMOLED) display panel; and a photosensitive device is disposed below the first display area.

A third aspect of the present application provides a display terminal, comprising: a device body having a device area; a display screen according to any one of the second aspect of the present application, covered on the device body; wherein, the device area is located below the first display area, and a photosensitive device for collecting light through the first display area is arranged in the device area.

The technical solution of the present application has the following advantages:
The display panel provided by the present application comprises a substrate, having a first surface for an external light entering therein and a second surface for an external light exiting therefrom; at least one diffractive relief structure, provided on the second surface of the substrate and used for reducing or eliminating a diffractive light formed on the second surface by the external light passing through the substrate.

The diffractive relief structure is arranged on the second surface of the display panel, and can be used to effectively eliminate the positive and negative order diffractive light formed on the second surface of the substrate by the external light entering the first surface of the substrate and exiting from the second surface, such that only 0th order diffractive light is left to enter the photosensitive element such as the camera below the second surface of the display panel, thereby eliminating or reducing the picture distortion phenomena such as ghosting and color fringing caused by the diffractive light, and improving the imaging quality, such that the overall consistency of the screen is good.

DETAILED DESCRIPTION

Figure 1:
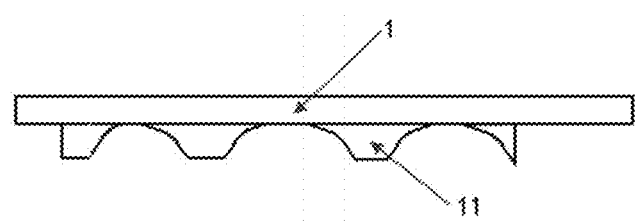
FIG. 1 is a schematic view showing a specific example of a display panel in the embodiments of the present application.

In order to make the purpose, technical solutions and advantages in the embodiments of the present invention clearer, the technical solutions in the embodiments of the present invention will be described as follows clearly and completely referring to figures accompanying the embodiments of the present invention, and surely, the described embodiments are just part rather than all embodiments of the present invention. Based on the embodiments of the present invention, all the other embodiments acquired by those skilled in the art without delivering creative efforts shall fall into the protection scope of the present invention.

It should be noted that, in the description of the present invention, orientation or position relationships indicated by terms such as "center", "longitudinal", "above", "below", "left", "right", "vertical", "horizontal", "top", "bottom", "inside" and "outside" are based on figure illustrations, and are merely intended to facilitate and simplify description of the present invention, rather than indicating or implying that the device or element concerned must be specifically oriented or constructed or operated in a specific manner, and thus shall not be construed as limitations on the present invention. In addition, it should be noted that when an element is referred to as being "formed on another element", the element can be directly connected to another element or there may be a middle element disposed between the two elements. When an element is considered to be "connected" to another element, the element can be directly connected to another element or there can be a middle element disposed between the two elements. On the contrary, when an element is referred to as being "directly on" another element, a middle element doesn't exist.

In order to achieve full display screen, the display screen needs to achieve a certain transparency to meet transparency requirements of cameras and the like. However, the inventors found that when a photosensitive element such as a camera is disposed below the display panel, the image obtained by photographing often suffers from blurring in a large degree. After research, the inventors found that the reason for the above problems is that due to the presence of conductive wirings in the display screen of the electronic device, when external lights pass through the conductive wirings, a relatively complicated diffraction intensity distribution will be produced, which results in diffraction fringes, and further affects normal operation of the photosensitive device, such as the camera. For example, in a transparent display screen, metal wirings in the display screen and patterns in the layers together form a two dimension-like grating, which will diffract the incident light, thereby blurring the image, and producing ghosting and color fringing. In addition, in the transparent display screen, each layer of thin film has different refractive index and different pattern, therefore, diffraction effects such as a two dimension-like grating also appear in the display screen. When light passes through the above structure, diffraction phenomenon will be generated, which severely affects the imaging quality, thereby distorting the image taken by the camera. Specifically, after the incident light passes through the display panel, multi-order diffractive lights will be formed. After the diffractive lights with different diffractive orders enter the photosensitive elements such as a camera, dark and bright fringes are formed in the photosensitive element, thereby further distorting the image taken by the camera and seriously affecting the image quality.

Therefore, the present application provides a display panel that can eliminate diffraction and optimize imaging quality, thereby solving the above problems well.

FIG. 1 is a cross-sectional view of a display panel in an embodiment, as shown in FIG. 1, the display panel comprises a substrate 1, having a first surface for an external light entering therein and a second surface for an external light exiting therefrom; at least one diffractive relief structure 11, provided on the second surface of the substrate and used for reducing or eliminating a diffractive light formed on the second surface by the external light passing through the substrate 1.

It should be noted that in the practical use, both surfaces of the display panel are light transmission, and the display panel has a front surface and a back surface, and the front surface of the display panel is used to display static or dynamic pictures, and the light emitted from the back surface of the display panel enters an external photosensitive element. The first surface of the substrate corresponds to the front surface of the display panel, and the second surface of the substrate corresponds to the back surface of the display panel. When an external photosensitive element such as a camera is used, an external light enters through the first surface of the substrate, and enters the photosensitive element after passing through the second surface of the substrate, therefore, the photosensitive element can collect lights.

The second surface of the display panel is provided with a diffractive relief structure, which can effectively eliminate the positive and negative order diffractive light formed on the second surface of the substrate, so that only the 0th order diffractive light is left to enter the photosensitive element such as the camera below the second surface of the display panel, thereby eliminating or reducing the problem of ghosting and color fringing caused by the diffractive light, and improving the imaging quality.

In an embodiment, the substrate 1 can be a rigid substrate, such as a transparent substrate including but not limited to a glass substrate, a quartz substrate, or a plastic substrate; the substrate 1 can also be a flexible substrate, such as a polyimide film (PI film), etc. so that the transparency of the display panel can be increased.

Figure 2:
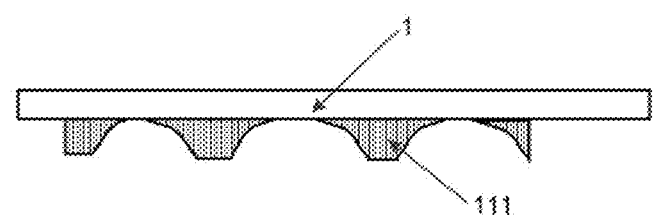
FIG. 2 is a schematic view showing another specific example of a display panel in the embodiments of the present application.

Optionally, as shown in FIG. 2, the diffractive relief structure 11 comprises an absorption layer 111; and the absorption layer is used to absorb the diffractive light formed on the second surface of the substrate by external light passing through the substrate. By absorbing the diffractive light formed on the second surface of the substrate, the purpose of eliminating or weakening the diffraction is achieved.

In an embodiment, the absorption layer is made of a material having a light absorption rate greater than 70%, which is beneficial to achieve the absorption of positive and negative orders of diffractive light while reducing production costs. Preferably, the material of the absorption layer can be black organic glue or black PEC film, etc., which can be reasonably determined according to actual needs. In other alternative embodiments, the light absorption rate of the absorption layer can also be set as other values, for example, the light absorption rate is greater than 80% or greater than 60%, the greater the light absorption rate, the better the absorption effect of diffractive light can be achieved, which can be reasonably determined according to actual needs and not limited herein.

Figure 3:
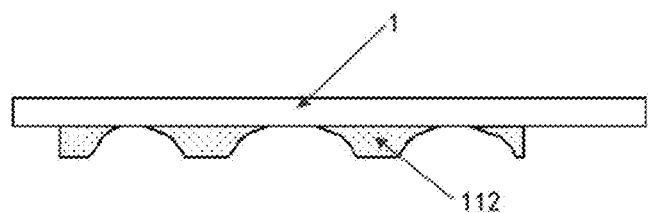
FIG. 3 is a schematic view showing another specific example of a display panel in the embodiments of the present application.

Optionally, as shown in FIG. 3, the diffractive relief structure comprises a reflection layer 112, which is used to reflect the diffractive light formed on the second surface of the substrate by external light passing through the substrate. By reflecting the diffractive light on the second surface of the substrate, the purpose of eliminating or weakening the diffraction is achieved.

In an embodiment, the reflection layer is made of a material with a light reflectivity rate greater than 90%, so that the diffractive light can be reflected to the greatest extent, thereby weakening the positive and negative orders of diffractive light entering the photosensitive element, and realizing the elimination of diffraction, meanwhile reducing production cost. Preferably, the reflection layer can be made of metal, such as silver. In other alternative embodiments, the light reflectivity rate of the absorption layer can also be set as other values, for example, light reflectivity rate can be greater than 95% or greater than 80%, the greater the light reflectivity rate, the better the reflection effect of the diffractive light can be achieved, which can be reasonably determined according to actual needs and not limited herein.

Figure 4:
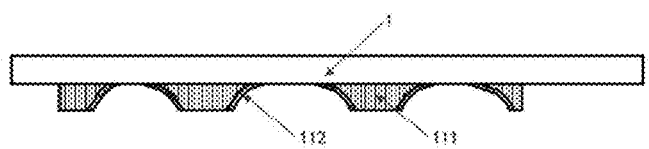
FIG. 4 is a schematic view showing another specific example of a display panel in the embodiments of the present application.

Optionally, as shown in FIG. 4, the diffractive relief structure comprises an absorption layer and a reflection layer; the absorption layer absorbs the diffractive light, and the reflection layer reflects the diffractive light. The diffractive relief structure can absorb and reflect the diffractive light that passes through the second surface of the substrate, and the double elimination or weakening of the diffraction makes the imaging quality better. Preferably, the reflection layer is arranged on the absorption layer, and the diffractive light is firstly absorbed by the absorption layer. If diffractive light cannot be completely absorbed, it is then reflected by the reflection layer arranged on the absorption layer, such that the diffractive light can be reflected back, and the positive and negative orders of diffractive light entering the photosensitive element below the display panel can be decreased, thereby achieving the purpose of eliminating or weakening diffraction. Certainly, in other embodiments, the positions of the reflection layer and the absorption layer can be reasonably set according to actual needs, and not limited herein.

In an embodiment, the diffractive relief structure has a plurality of grooves, and an inner wall of each of the plurality of grooves has a curved surface, and a curved line of a longitudinal section of the curved surface comprises a plurality of curved lines connected with each other and having different curvature radii. Diffractive light with different diffraction orders has different diffraction paths, and diffractive lights having different diffraction paths correspond to different curved lines. The above-mentioned diffractive relief structure are provided with curved lines having different curvature radii for diffractive lights of each diffraction order to achieve the best elimination of diffraction or weakening of the diffraction effect.

In an embodiment, the first surface of the substrate is provided with a pixel array, the plurality of grooves have a one-to-one correspondence with sub-pixels in the pixel array, and the sub-pixels of the same color type correspond to the same shapes of the inner walls of the grooves, and the sub-pixels of different color types correspond to different shapes of the inner walls of the grooves. Specifically, the sub-pixels of different color types have different diffraction effects for the light, and the diffraction formed by the light after passing the substrate is also different. Different types of diffractive lights can be separately eliminated or weakened to achieve a better imaging effect. Specifically, as shown in the diffraction formula:

$$d = \frac{k\lambda}{2\sin\theta},$$

wherein, k represents a diffraction order, λ represents a wavelength of the diffractive light, θ represents a diffraction angle of the diffractive light with k order, d represents a distance from a diffractive surface to a receiving surface.

Figure 5:
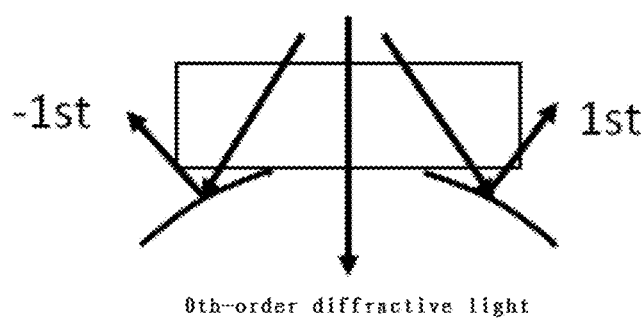
FIG. 5 is a schematic view showing a specific example of a method for determining the shape of the inner wall of groove in the display panel in the embodiments of the present application.

As shown in the above formula, a red sub-pixel (R), blue sub-pixel (G), and green sub-pixel (B) respectively have different wavelengths, therefore the positions of the diffraction orders and diffraction angles corresponding to the red sub-pixel (R), blue sub-pixel (G), and green sub-pixel (B) are different, which requires different shapes of the inner walls of the plurality of grooves. As shown in FIG. 5, the shapes of the inner walls of the plurality grooves can be determined by optical simulation calculation according to the positive first-order diffractive light (1st), negative first-order diffractive light (−1st) and 0th-order diffractive light; shapes of the inner walls of the grooves corresponding to other higher-orders of the diffractive lights can be determined by the same method, and will not be described herein.

When external lights (such as white light) pass through the sub-pixels of the display panel, the external lights need to pass through a light-emitting material layer of the sub-pixel. Different types of the light-emitting material layers have different light transmittance for external lights, such that the types of the external lights transmitted through the light-emitting material layer are different. For example, when the external lights pass through the light-emitting material layer of the red sub-pixel, the light-emitting material layer has a high light transmittance for red light, and a low light transmittance for lights of other colors, such that after external lights pass through light-emitting material of the red sub-pixel, red light is mainly remained, and the diffractive lights that reach the external photosensitive element after passing through the substrate is mainly red lights. Therefore, the wavelength in the above diffraction formula corresponds to the wavelength of red light.

The above diffraction formula is described by taking light normally incident on the substrate as an example. Certainly, in other alternative embodiments, an incident direction of the lights may also be different. When the light is non-vertical incident, the non-vertical incident diffraction formula is different from the vertical incident diffraction formula and can be more complicated. The shape of the inner wall of the groove can be determined according to actual situation.

In an embodiment, the curvature radius of each curved line of the plurality of curved lines connected with each other and having different curvature radii is mainly determined by a diffraction order, a wavelength and an incident direction of the diffractive light. Various factors affect the diffractive lights formed on the second surface of the substrate, and the effect of eliminating or weakening the diffractive light can be optimized according to the curve obtained by considering all these factors.

Preferably, the curvature radii of the plurality of curved lines connected with each other and having different curvature radii decrease gradually in a direction from the center of the grooves towards the openings of the grooves. Specifically, the bottom of the groove corresponds to elimination of a 0th order diffractive light, and positions in a direction from the center to both sides of the curved line respectively correspond to an elimination of a positive and negative first order diffractive light, an elimination of positive and negative second-order diffractive light, and an elimination of higher-order diffractive light. The higher the diffraction order of the diffractive light, the greater the curvature radius corresponding to the diffraction order, so that the diffractive lights can be weakened in maximum; Certainly, in other Examples, the curvature radii of different curved lines can be specifically determined according to actual diffractive lights.

Figure 6:
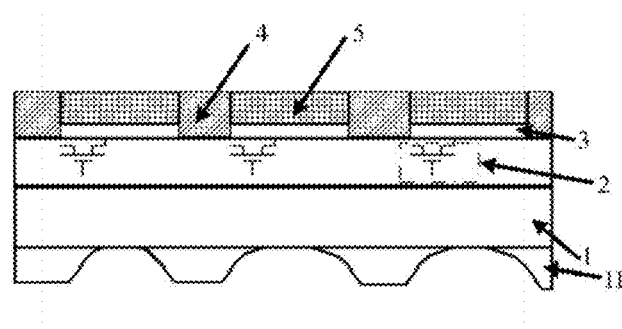
FIG. 6 is a schematic view showing another specific example of a display panel in the embodiments of the present application.

In an embodiment, the first surface of the substrate is provided with a pixel array, and the plurality of grooves have a one-to-one correspondence with sub-pixels in the pixel array. Specifically, an arrangement position of the groove on the second surface of the substrate is determined according to the arrangement of the pixel array, which can be used to perform pixel-by-pixel optimization. As shown in FIG. 6, each groove corresponds to one sub-pixel.

In an embodiment, a width of the opening of each groove is greater than a width of each sub-pixel to eliminate or weaken the positive and negative order diffractive light as much as possible when the light emitted by the sub-pixel passes through the substrate. Certainly, in other alternative embodiments, the width of the opening of the groove can be reasonably determined according to the actual situation and not limited herein.

In an embodiment, a plurality of grooves are connected through the first connecting portion; and a coverage area of the first connecting portion is determined according to the specific arrangement of the pixel array, which can be used to effectively ensure that the plurality of grooves have an one-to-one correspondence to the sub-pixels, so that the effect of eliminating or weakening the diffraction of pixels can be optimized.

Preferably, the first connecting portion has a thickness no more than 10 um and this type of arrangement reduces the production cost while ensuring a better diffraction elimination or weaken effect; Certainly, in other alternative embodiments, the thickness of the first connecting portion can be set to other values, and the specific value can be reasonably determined according to actual needs.

In an embodiment, the material of the second surface of the substrate is exposed at the bottom of the groove. Specifically, the bottom of the groove is not covered with an absorption layer or a reflection layer. While eliminating or weakening positive and negative orders of the diffractive lights, this type of structure can be used to ensure that the required lights can reach the photosensitive element as much as possible, thus improving the imaging quality at the same time.

It should be noted that, in the actual manufacturing process, the diffractive relief structure in the Example can be a layer of impressing soft material (such as black organic glue) arranged on the second surface of the substrate, the groove can be formed on the impressing soft material through a mold; or a hard material can be prepared on the second surface of the substrate, and the groove is formed by a photolithography process; or the groove can also be formed by other conventional methods which is not limited herein. In addition, the diffractive relief structure can also be prepared separately. After the preparation, the diffractive relief structure can be attached to the second surface of the substrate. Specifically, the diffractive relief structure can be processed into a thin film or a chip type structure, and then it can be attached to the substrate according to a position mark. A person skilled in the art can make various modifications and variations without departing from the spirit and scope of the present application, and such modifications and variations fall within the protection scope defined by the Example.

It should also be noted that the shapes of the inner walls of the grooves corresponding to the sub-pixels of different color types are different, which can be determined according to actual tests. For example, the diffraction phenomenon of the lights transmitted through the position of the same type of sub-pixels on a plurality of display panels produced in the same batch are consistent. Selecting some of the sub-pixels as the test samples to obtain the shape of the groove corresponding to the type of the sub-pixel. Other types of sub-pixels can also be tested accordingly in the same way to obtain the shape of the groove accordingly, and the diffractive relief structure in the Example can be obtained through the above test sample. It should also be noted that when the materials and the process parameter settings are the same, the diffractions that occurs on the display panels produced by different batches are also the same. The diffractive relief structure obtained by one test can be applied to the display panel of all batches of production. it is no need to test the display panel in every batch, which improves efficiency.

FIG. 6 is a cross-sectional view of a display panel in an embodiment. As shown in FIG. 6, the above display panel further comprises: a pixel circuit 2 arranged on the substrate 1; a first electrode layer arranged on the pixel circuit 2 wherein the first electrode layer comprises a plurality of the first electrodes 3, and the pixel circuits 2 have an one-to-one correspondence with the first electrode 3; a pixel defining layer 4, having a plurality of openings, wherein a light emitting structure layer 5 is provided in the openings to form a plurality of sub-pixels, and the sub-pixel have one-to-one correspondence with the first electrodes 3; and the scan lines and data lines all connected to the pixel circuit 2.

In an embodiment, the light emitting structure layer can be a light emitting structure layer between an anode and a cathode in an Organic Light-Emitting Diode (OLED).

Figure 7:
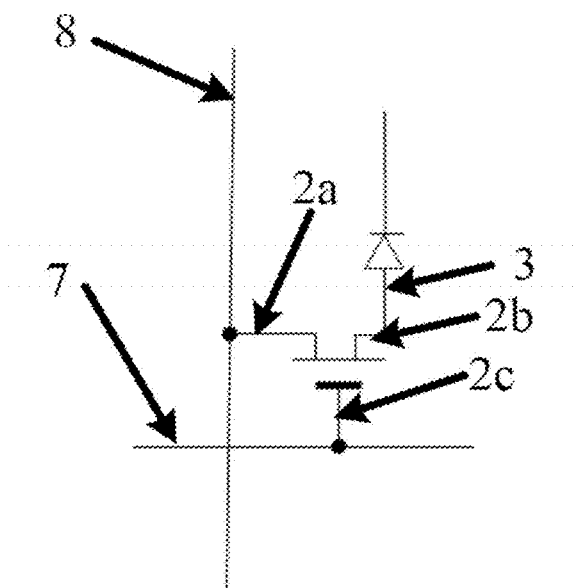
FIG. 7 is a schematic view showing another specific example of a display panel in the embodiments of the present application.

In an embodiment, the pixel circuit 2 comprises at least one switching device. The switching device comprises a first terminal 2a, a second terminal 2b, and a control terminal 2c, which will be described below in detail. The scanning line 7 is connected to the control terminal 2c of the switching device. The data line 8 is connected to a first terminal 2a of the switching device, and the first electrode 3 is connected to a second terminal 2b of the switching device. As shown in FIG. 7, the pixel circuit 2 comprises a switching device, and the switching devices has an one-to-one correspondence with the first electrode 3, the data line 8 is connected to the first terminal 2a of the switching device, and the scanning line 7 is connected to the control terminal 2c of the switching device. A plurality of sub-pixels have an one-to-one correspondence with a plurality of switching devices, that is, one sub-pixel corresponds to one switching device. The data line is connected to the first terminal of the switching device, and the scanning line is connected to the control terminal of the switching device, and the number of switching devices in the pixel circuit is reduced to one, which greatly reduces a load current of the scanning line and the load current of the data line.

Optionally, the pixel circuit can also comprise two switching devices or even more switching devices, and can also comprise a capacitive element, and a plurality of switching devices can be connected in series or in parallel as needed, such as 2T1C, 7T1C and other pixel circuit, which is not limited in the Example. For example, the pixel circuit comprises two switching devices (a first switching device and a second switching device); when the two switching devices are connected in series, the control terminal of the first switching device and the control terminal of the second switching device are connected to each other and then together connected with the scanning line. The first terminal of the first switching device is connected to the data line, the second terminal of the first switching device is connected to the first terminal of the second switching device, and the second terminal of the second switching device is connected to the first electrode. When two switching devices are connected in parallel, the control terminal of the first switching device and the control terminal of the second switching device are connected to each other and then together connected to the scanning line. The first terminal of the first switching device and the first terminal of the second switching device are connected to each other, and then together connected to the data line, and the second terminal of the first switching device and the second terminal of the second switching device are connected to each other and then connected to the first electrode.

In an embodiment, when the pixel circuit comprises a switching device, and the switching device is a driving Thin Film Transistor (TFT), the first terminal 2a is a source electrode of the driving TFT, the second terminal 2b is the drain electrode of the driving TFT, and the control terminal 2c is the gate of the driving TFT. The driving TFT is a top gate structure or a bottom gate structure. In the actual manufacturing process, the source electrode and the drain electrode of the TFT have the same structure and can be interchanged. In the Example, for convenience of description, the source electrode of the thin film transistor is used as a first terminal, and the drain electrode of the thin film transistor is used as a second terminal. Certainly, in other embodiments, the drain electrode of the thin film transistor can also be used as the first terminal, and the source electrode of the thin film transistor can be used as the second terminal. Optionally, the switching device can also be a Metal-Oxide Semiconductor Field-Effect Transistor (MOSFET), or can be other elements that conventionally have switching characteristics, such as Insulated Gate Bipolar Transistors (IGBT), etc., electronic components that can realize the switching function in the Example and can be integrated into the display panel fall within the protection scope of the present application.

In an embodiment, the thin film transistor can be an oxide thin film transistor or a low temperature polycrystalline silicon thin film transistor (LTPS TFT). The thin film transistor is preferably an indium gallium zinc oxide thin film Transistor (IGZO TFT). The low-temperature polycrystalline thin silicon film transistor has advantages of high electron mobility, high resolution, simpler design and better display effect; and the oxide thin film transistor has advantages of high optical transmittance, mature technology and simple preparation.

In an embodiment, the thin-film transistor can be configured to be a top-gate structure. The number of photolithographic masks required for the top-gate structure TFT is relatively less, and the manufacturing process is simple, and the cost is low; Certainly, in other alternative embodiments, the thin-film transistor i can be configured to be a bottom-gate structure which requires a complicated manufacturing process. The gate and the gate insulating layer of the TFT can be used as an optical protective film, which has good optical characteristics.

The scanning line is connected to the gate electrode. In order to simplify the processing steps and save the technical processes, the scanning line and the gate electrode are formed in the same processing step. In an optional embodiment of the present application, specifically, the scanning line and the gate electrode can be made of an Indium Tin Oxide (ITO) material, and in the manufacturing process, one ITO layer may be manufactured firstly, and then the ITO layer can be patterned by a first mask to simultaneously form the scanning line and the gate electrode. Optionally, the scanning line can be disposed above or below the gate electrode, and the gate electrode and the scanning line need to be formed separately.

In order to simplify the processing steps and save technical processes, the data line and the first electrode can be formed in the same processing step. In an optional embodiment, the data line and the first electrode are both made of ITO material, wherein one overall surface of ITO is manufactured, and the ITO layer can be patterned by a second mask to simultaneously form the data line and the first electrode. Optionally, when the data line and the first electrode are made of different materials, the data line and the first electrode may also be formed separately.

Optionally, in order to maximize the overall transparency of the display panel, all of the first electrode, the second electrode, the data line and the scanning line are made of a transparent conductive material with a light transmittance of greater than 90%, such that the entire display panel has a light transmittance of greater than 70%, and the display panel has a higher transparency.

Specifically, the transparent conductive materials can be indium tin oxide (ITO), indium zinc oxide (IZO), or silver-doped indium tin oxide (Ag+ITO), or silver-doped indium zinc oxide (Ag+IZO). Since the ITO has mature processing technique and low cost, preferably the conductive material is indium zinc oxide. Furthermore, in order to reduce electrical resistance of each conductive wiring on the basis of ensuring high light transmittance, the transparent conductive material can be aluminum-doped zinc oxide, silver-doped ITO or silver-doped IZO.

Optionally, the transparent conductive material may be other conventional materials, which may be appropriately chosen according to actual needs, which is not limited herein. Optionally of the present application, at least one of the first electrode, the second electrode, the data line and the scanning line can be made of a transparent conductive material.

A plurality of scanning lines extend in parallel along a first direction, a plurality of data lines extend in parallel along a second direction, the first direction intersects with the second direction and at least one side of the scanning line and/or the data line in the extending direction thereof has a wave shape. Optionally, the scanning lines extend in the X direction, the data lines extend in the Y direction, and the projections of the data lines and the scanning lines on the substrate are perpendicular to each other, both sides of each scanning line in the extending direction thereof have a wave shape, and both sides of each data line in the extending direction thereof also have a wave shape. The data lines and the scanning lines that have wave shapes can generate diffraction fringes having different positions and diffusion directions, thereby weakening the diffraction effect, therefore, when a camera is disposed below the display panel, the image acquired by the camera has a higher definition.

Figure 8:
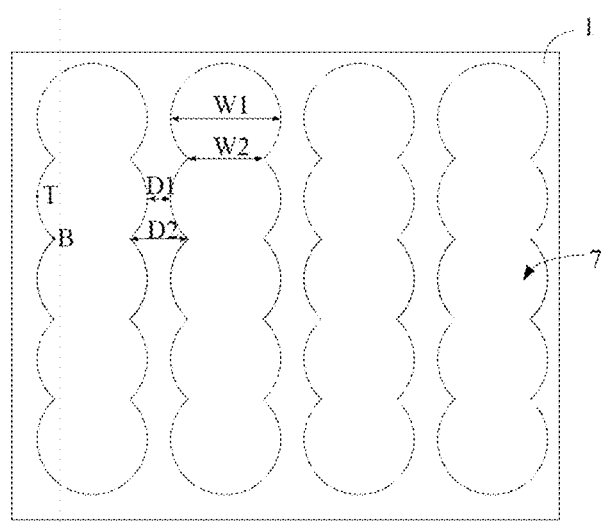
FIG. 8 is a schematic view of a specific example of scanning lines of the display panel in the embodiments of the present application.

Optionally, as the scanning lines have a wave shape, a first distance is arranged between adjacent scanning lines and changes continuously or intermittently; and a width of each scanning line changes continuously or intermittently. Changing continuously in width means that any two adjacent positions on the scanning line have different widths. In FIG. 8, the extending direction of the scanning line 7 is a longitudinal direction thereof. The scanning lines continuously change in width in the extending direction thereof. Changing intermittently in width means that there are certain segments on the scanning line where two adjacent positions have the same width, and there are other segments on the scanning line where two adjacent positions have different widths. In an embodiment of the present application, a plurality of scanning lines are regularly arranged on the substrate, and therefore, the distance between two adjacent scanning lines also exhibits continuous change or intermittent change in a direction parallel to the extending direction of the scanning lines. The scanning lines can change periodically in width in the extending direction thereof regardless of whether the width thereof is changing continuously or changing intermittently.

Figure 9:
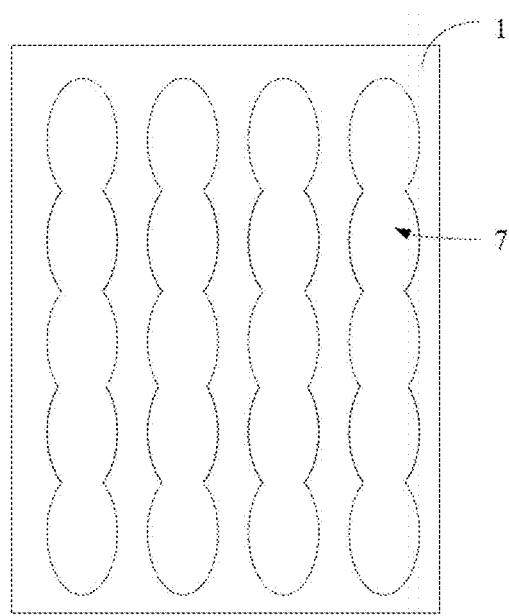
FIG. 9 is a schematic view showing another specific example of scanning lines of a display panel in the embodiments of the present application.

Both sides of the scanning line in the extending direction thereof have a wave shape, and wave peaks of the two sides are oppositely disposed, and wave troughs thereof are oppositely disposed. As shown in FIG. 8, the wave peaks T of the two sides in the extending direction are oppositely disposed and the wave troughs B thereof are oppositely disposed. The width between the wave peaks of the same scanning line is W1, and the width between the wave troughs of the same scanning line is W2. The distance between the wave peaks of two adjacent scanning lines is D1, and the distance between the wave peaks of two adjacent scanning lines is D2. In an embodiment of the present application, both sides thereof are connectable by the same circular arc. In other embodiments, both sides thereof may also be connectable by the same elliptical line, as shown in FIG. 9. By setting both sides of each scanning line 7 into a wave shape connectable by a circular arc shape or an elliptical shape, it can be ensured that the diffraction fringes generated by the scanning lines can be spread in different directions, so that a more notable diffraction effect is not generated.

Figure 10:
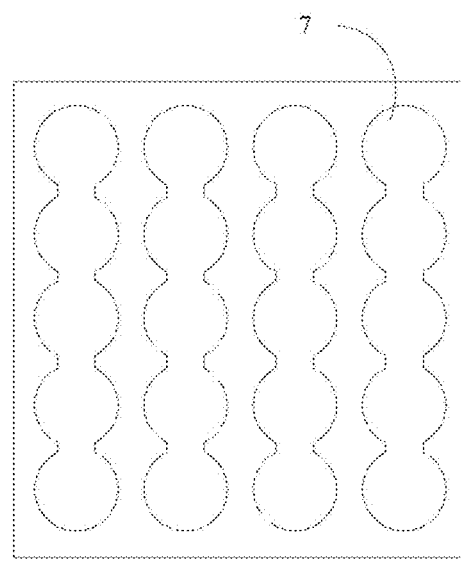
FIG. 10 is a schematic view showing another specific example of scanning lines of a display panel in the embodiments of the present application.

Optionally, a second connecting portion is formed at a position where the wave troughs of the wave shaped scanning line are oppositely disposed, and the second connecting portion may be rectilinear or curvilinear. As shown in FIG. 10, the second connecting portion is strip-shaped, and the second connecting portion is an area where the scanning line is electrically connected to the switching device, that is, a position where the control terminal of the switching device is connected to the second connecting portion. In other embodiments, the second connecting portion may also have other irregular structures, such as a shape which is large at both ends and small in the middle, or a shape which is small at both ends and large in the middle.

Optionally, as the data lines have a wave shape, a second distance is arranged between adjacent data lines and changes continuously or intermittently; and a width of each data line changes continuously or intermittently. The data line is similar to the scanning line, referring to the detailed description of the data line, and the details thereof are not repeatedly described herein. The data line can have any of the wave shapes in FIGS. 8-10. Both sides of each data line in the extending direction thereof have a wave shape, and wave peaks of both sides are oppositely disposed, and wave troughs thereof are oppositely disposed. A third connecting portion is formed at a position where the wave troughs of the data line are oppositely disposed, and the third connecting portion is an area where the data line is electrically connected to the switching device. The setting of the data line is similar to that of the scanning line, and the details thereof can be refer to the setting of the scanning lines.

The scanning lines and data lines on the display panel have any one of the wave shapes as shown in FIGS. 8-10 to ensure that incident light can form diffraction fringes having different positions when passing through the locations with different widths and different distances between adjacent wirings in the extending direction of the data lines and the scanning lines, thereby diminishing the diffraction effect, so that the photosensitive device arranged below the display panel can work normally.

Figure 11:
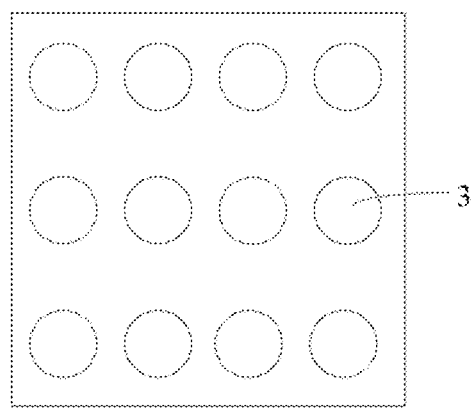
FIG. 11 is a schematic view showing a specific example of a first electrode of a display panel in the embodiments of the present application.
Figure 12:
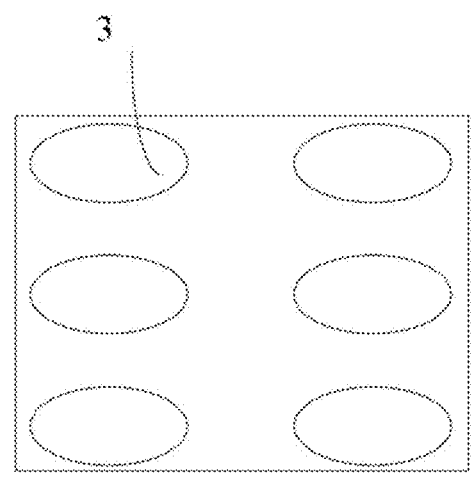
FIG. 12 is a schematic view showing another specific example of a first electrode of the display panel in the embodiments of the present application.
Figure 13:
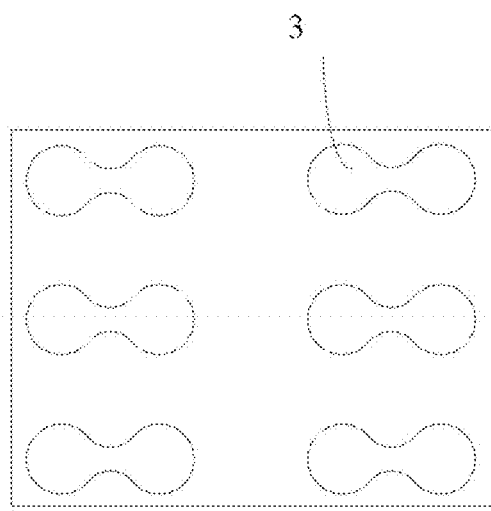
FIG. 13 is a schematic view showing another specific example of a first electrode of the display panel in the embodiments of the present application.

Optionally, the first electrodes are circular as shown in FIG. 11, elliptical as shown in FIG. 12 or dumbbell shaped as shown in FIG. 13. It can be understood that the first electrode can also be formed by other curved lines having different curvature radii at other positions thereof. When light passes through an obstacle such as a slit, a small hole, or a disc, it will be bent with different degrees, thereby deviating from an original straight line. This phenomenon can be called diffraction. During the diffraction process, the distribution of diffraction fringes is affected by the size of obstacles, such as a width of the slit and the size of the small hole. The positions of the diffraction fringes at the positions with the same width are consistent, such that a more obvious diffraction effect will occur. By changing the anode in the shape of a circle, ellipse, or dumbbell, it can be ensured that when light passes through the anode layer, diffraction fringes with different positions and diffusion directions can be generated at positions with different width of the anode, thereby weakening the diffraction effect, and thus ensuring when the camera is set below the display panel, the image obtained by photographing has higher definition.

The sides of a projection of the opening formed in the pixel-defining layer projected on the substrate are not parallel to each other and the respective side are curved, that is, the opening has varying widths in every direction and thus has different diffraction spreading directions at the same location. When external incident light passes through the opening, diffraction fringes having different positions and diffusion directions can be generated at the locations with different widths, so that a notable diffraction effect is not generated, thereby ensuring the photosensitive element disposed below the display panel can work normally.

The openings on the conventional pixel-defining layer are all set to be rectangular or square according to the size of the pixel. Taking a rectangular opening as an example, as a rectangular shape has two sets of parallel sides, so that it has the same width in a length direction and a width direction. Therefore, when external incident light passes through the opening, diffraction fringes having the same position and diffusion direction can be generated at different locations in the length direction and a width direction, such that a significant diffraction effect can be generated, making the photosensitive element located below the display panel unable to work normally. The display panel in the Example can solve the above problem well and ensure that the photosensitive element located below the display panel can work normally.

Optionally, the sides of a projection of the opening projected on the substrate can have at least of a circle shape, an ellipse shape, and other curved lines shape with varying curvatures radii. when the light passes through the opening, as the sides of the opening are curved lines, the generated diffraction fringes will not spread in one direction, but in directions of 360 degrees, so that the diffraction is very insignificant and has a better effect for eliminating and weakening diffraction.

Optionally, a projection graphic unit of the opening on the substrate is circular, elliptical, dumbbell-shaped or wavy, which is similar to the shape of the first electrode and can be referred to the first electrode, as shown in FIGS. 11-13, and not repeated here. The shape of the projection of the opening projected on the substrate can be determined according to the shape of the corresponding light emitting structure. For example, the number of the openings can be determined according to the aspect ratio of the light emitting structure. In an embodiment, the projection of the opening on the substrate can have an axisymmetric structure, thereby ensuring that each pixel on the entire display panel has a uniform opening ratio, which does not affect the final display effect. As shown in FIG. 11, when the projection of the opening on the substrate is a circle, the corresponding light emitting structure has a rectangle or a square shape with an aspect ratio of less than 1.5, and the symmetry axis of the projection of the opening corresponds to the symmetry axis of the corresponding light emitting structure. The diameter of the circle projection is smaller than the minimum width of the light emitting structure. Specifically, the diameter of the circle projection can be determined according to the shape of the light emitting structure combined with a comprehensive aperture ratio. Since the determination process can be performed by a conventional method for determining the size of the opening, it will not be described herein.

When the aspect ratios of the sub-pixels corresponding to the openings are between 1.5 and 2.5, the projection has a dumbbell shape formed by two circles communicating with each other. The two circles are arranged along a length direction of the corresponding light emitting structure. In an embodiment, a connecting portion is formed between the two circles, and both sides of the connecting portion are curved, ensuring when the light passes through the connecting portion, it can also diffuse in various directions, thereby improving the diffraction effect.

When the aspect ratio of the light emitting structure corresponding to the opening is greater than 2.5, the projection has a wave shape formed by three or more circles communicating with each other. The three or more circles are arranged along the length direction of the corresponding light emitting structure. In an embodiment, a connecting portion is also formed in the projection. The connecting portion has an arc shape, that is, the three or more circles are connected by arc lines, so as to ensure that the light can diffuse in all directions when passing through the connecting portion, thereby reducing the diffraction effect.

Figure 14:
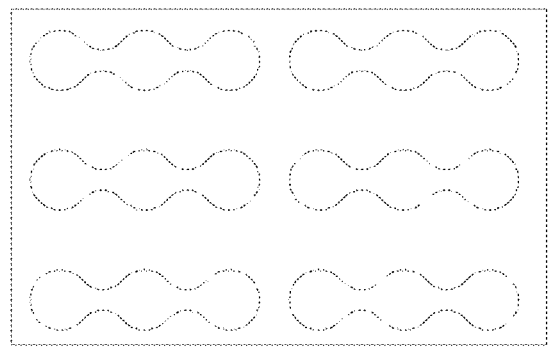
FIG. 14 is a schematic view showing a specific example of opening of the pixel defining layer of the display panel in the embodiments of the present application.

When the aspect ratio of the light emitting structure corresponding to the opening is equal to 1.5, the projection has a circle shape, or a dumbbell shape formed by two circles communicating with each other. When the aspect ratio of the light emitting structure corresponding to the opening is equal to 2.5, the projection has a dumbbell shape formed by two circles communicating with each other, or a wave shape formed by three circles communicating with each other, as shown in FIG. 14.

Optionally, as shown in FIGS. 11-13, the shapes of the sub-pixels are the same as the shapes of the above openings, that is, the sub-pixel is circular, elliptical, or dumbbell-shaped. Further, a shape design rule of the anode can also refer to the design rule of the openings which can be used to further reduce the diffraction effect. Certainly, the anode can also designed as a conventional rectangular design.

The embodiments of the present application further provide a display screen which comprises a first display area, and the first display area is provided with the display panel of any of the above embodiments, and a photosensitive element is provided below the first display area.

Since the display panel according to any of the above embodiments is used in the first display area, when incident lights pass through this display area, a diffraction effect will be weakened or avoided, thereby ensuring that the photosensitive device arranged below the first display area can work normally. The first display area can normally display dynamic or static images when the photosensitive device is not working, and the first display area is in a non-displaying state when the photosensitive device is working, thereby ensuring that light collection by the photosensitive device can be performed normally through the display panel and a diffraction effect will be weakened or avoided, thereby improving the imaging quality.

The above display panel also comprises a second display area, and the second display area is provided with a PMOLED display panel or an AMOLED display panel.

Figure 15:
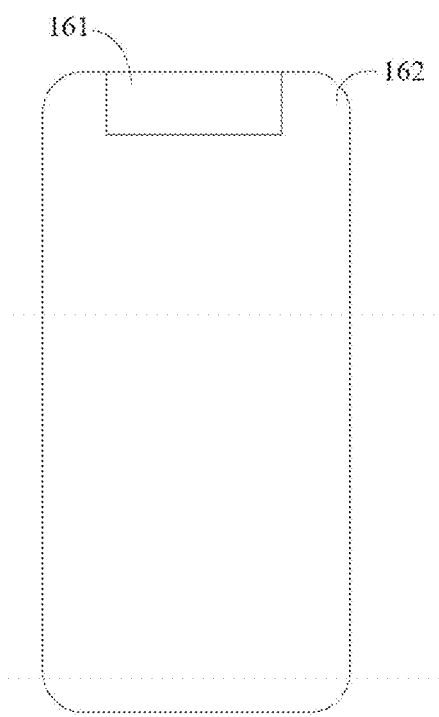
FIG. 15 is a schematic view showing a specific example of a display screen in the embodiments of the present application.

Optionally, as shown in FIG. 15, the display screen comprises a first display area 161 and a second display area 162, each of which is used to display a static or dynamic image, and the display panel mentioned in any of the above embodiments is used in the first display area 161, and the first display area 161 is located at the upper portion of the display screen.

Optionally, the display screen may also comprise three or more display areas, such as three display areas (a first display area, a second display area, and a third display area). The display panel mentioned in any of the above embodiments is used in the first display area. The display panels used in the second display area and the third display area is not limited herein, and the display panels may be a PMOLED display panel or an AMOLED display panel, and certainly, the display panel in any of the embodiments of the present application can also be used.

The embodiments of the present application further provide a display terminal comprising the above-mentioned display screen overlaid on an apparatus body. The display terminal may be a product or a component having a display function, such as a mobile phone, a tablet PC, a television, a display screen, a palmtop computer, an iPod, a digital camera, a navigator, or the like.

Figure 16:
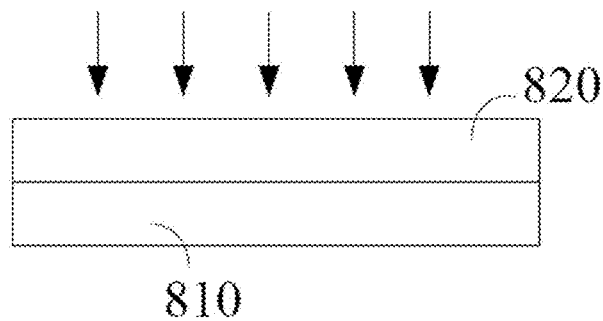
FIG. 16 is a schematic view showing a specific example of a display terminal in the embodiments of the present application.

FIG. 16 shows a schematic structural view of a display terminal in one embodiment, the display terminal comprises an apparatus body 810 and a display screen 820. The display screen 820 is disposed on the apparatus body 810 and is interconnected with the apparatus body 810. The display screen 820 can be the display screen according to any of the above embodiments, and is used for displaying a static or dynamic image.

Figure 17:
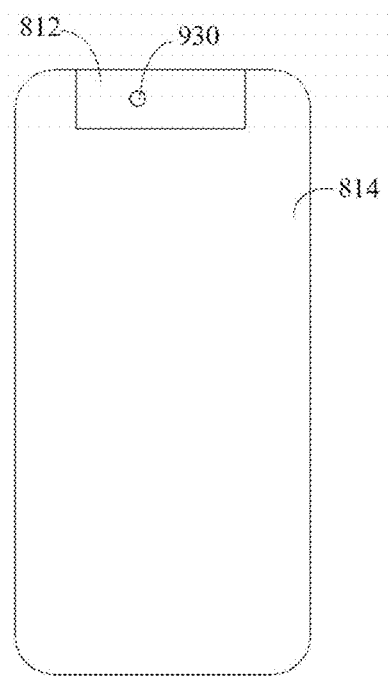
FIG. 17 is a schematic structural view showing a device body in the embodiments of the present application.

FIG. 17 shows a schematic structural view of an apparatus body 810 in an embodiment. In this embodiment of the present application, the apparatus body 810 can be provided with a slotted region 812 and a non-slotted region 814. A photosensitive device such as a camera 930, a light sensor and a light inductor or the like may be disposed in the slotted region 812. At this time, the display panel of the first display area of the display screen 820 is attached to the slotted region 812 in a corresponding way so that the above-mentioned photosensitive device such as the camera 930, and light sensor, can collect external lights through the first display area. Since the display panel in the first display area can effectively alleviate diffraction phenomenon generated by external incident lights passing through the first display area, thereby effectively improving the quality of the image captured by the camera 930 on the display terminal, and preventing image distortion of the captured image due to diffraction, while also improving the accuracy and sensitivity of the light sensor for sensing external light.

Although the embodiments of the present application have been described with reference to the appended drawings, various modifications and variations can be made by a person skilled in the art without departing from the gist and scope of the present application. Such modifications and variations fall within the scope defined by the attached claims.

What is claimed is:

1. A display panel, comprising:
   a substrate, having a first surface for external light entering the display panel and a second surface for the external light exiting from the display panel; and
   at least one diffractive relief structure, provided on the second surface of the substrate and used for reducing or eliminating a diffractive light transformed from the external light when the external light passes through the second surface of the substrate;
   wherein the diffractive relief structure has a plurality of grooves, and an inner wall of each of the plurality of grooves has a curved surface, and a curved line of a longitudinal section of the curved surface comprises a plurality of curved lines connected with each other and having different curvature radii.

2. The display panel according to claim 1, wherein the diffractive relief structure is an absorption layer or a reflection layer.

3. The display panel according to claim 1, wherein the diffractive relief structure comprises an absorption layer and a reflection layer, and the reflection layer is arranged on the absorption layer.

4. The display panel according to claim 3, wherein the absorption layer is made of a material having a light absorption rate greater than 70%, and/or the reflection layer is made of a material having a light reflectivity rate greater than 90%.

5. The display panel according to claim 1, wherein a curvature radius of each curved line of the plurality of curved lines connected with each other and having different curvature radii is mainly determined by a diffraction order, a wavelength and an incident direction of the diffractive light.

6. The display panel according to claim 1, wherein a curvature radius of the plurality of curved lines connected with each other and having different curvature radii is determined by the following formula:

$$d = \frac{k\lambda}{2\sin\theta},$$

wherein, k represents a diffraction order, $\lambda$ represents a wavelength of the diffractive light, $\theta$ represents a diffraction angle of the diffractive light with k order, d represents a distance from a diffractive surface to a receiving surface, and
the curvature radii of the plurality of curved lines connected with each other and having different curvature radii decrease gradually in a direction from a center of each of the plurality of grooves towards an opening edge of each of the plurality of grooves.

7. The display panel of claim 1, wherein
the first surface of the substrate is provided with a pixel array, and
the plurality of grooves have a one-to-one correspondence with sub-pixels in the pixel array, and
a width of an opening of each groove is greater than a width of each sub-pixel.

8. The display panel of claim 1, wherein the plurality of grooves are connected by a first connecting portion.

9. The display panel of claim 8, wherein the first connecting portion has a thickness no more than 10 μm.

10. The display panel of claim 1, wherein a material of the second surface of the substrate is exposed at bottoms of the plurality of grooves.

* * * * *